United States Patent [19]

Bleil

[11] Patent Number: 4,873,063
[45] Date of Patent: Oct. 10, 1989

[54] APPARATUS FOR ZONE REGROWTH OF CRYSTAL RIBBONS

[76] Inventor: Carl E. Bleil, 132 Chalmers Dr., Rochester, Mich. 48063

[21] Appl. No.: 172,760

[22] Filed: Mar. 28, 1988

Related U.S. Application Data

[63] Continuation-in-part of Ser. No. 826,596, Feb. 6, 1986, Pat. No. 4,775,443, and a continuation-in-part of Ser. No. 816,424, Jan. 6, 1986, Pat. No. 4,749,438.

[51] Int. Cl.$^4$ .................................................... C30B 35/00
[52] U.S. Cl. .................................. 422/250; 156/620.71; 156/620.73; 156/620.75; 156/DIG. 88; 373/17; 373/67; 373/85; 373/139
[58] Field of Search ............... 422/250; 373/17, 67, 373/85, 139; 156/620.71, 620.73, 620.75, DIG. 88

[56] References Cited

U.S. PATENT DOCUMENTS

| | | | |
|---|---|---|---|
| 2,415,025 | 1/1947 | Grell et al. | 156/620 |
| 2,719,799 | 10/1955 | Christian | 373/139 |
| 3,189,419 | 6/1965 | Wilcox | 156/620.75 |
| 3,198,929 | 8/1965 | Stut | 373/139 |
| 3,378,409 | 4/1968 | Hurle et al. | 156/620 |
| 3,389,987 | 6/1968 | Lebek et al. | 156/620.73 |
| 3,681,033 | 8/1972 | Bleil | 422/249 |
| 3,759,671 | 9/1973 | Bleil | 422/249 |
| 3,844,724 | 10/1974 | Sloan | 422/250 |
| 4,220,626 | 9/1980 | Gregory et al. | 422/250 |
| 4,226,834 | 10/1980 | Shudo et al. | 422/249 |
| 4,325,777 | 4/1982 | Yarwood et al. | 156/620 |
| 4,417,944 | 11/1983 | Jewett | 156/617 H |
| 4,539,688 | 9/1985 | Weber | 373/67 |
| 4,563,976 | 1/1986 | Foell et al. | 156/617 H |
| 4,749,438 | 6/1988 | Bleil | 156/DIG. 88 |
| 4,775,443 | 10/1988 | Bleil | 156/DIG. 88 |

FOREIGN PATENT DOCUMENTS 58-147024  9/1983  Japan .............................. 156/617 R Primary Examiner—John Doll
Assistant Examiner—Robert M. Kunemund
Attorney, Agent, or Firm—Warren D. Hill

[57] ABSTRACT

Apparatus for producing crystalline ribbons of a material from a "crucible-less" configuration of bodies of the material including possible deposition on a substrate. Means for capacitively coupling electromagnetic energy into a source body of material are provided to appropriately induce electrical current gradients in order to control and restrict the molten zone and supress net loss of the heat of fusion from the balance of the ribbon-like body. The melt zone is replenished from any direction with ribbon or a bulk source to sustain the shape and size of the growing ribbon-like body. The heat of crystallization is selectively removed by a heat sink from one end of the melt zone in a direction substantially perpendicular to the direction of pulling.

21 Claims, 5 Drawing Sheets

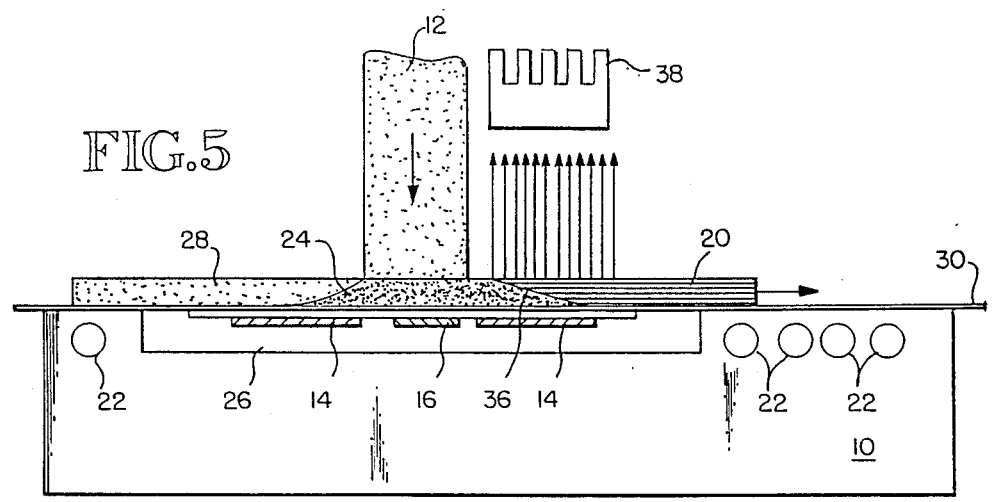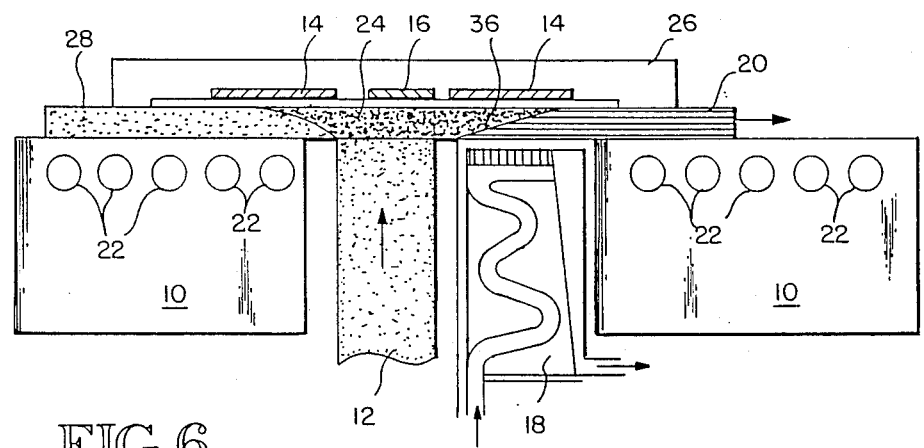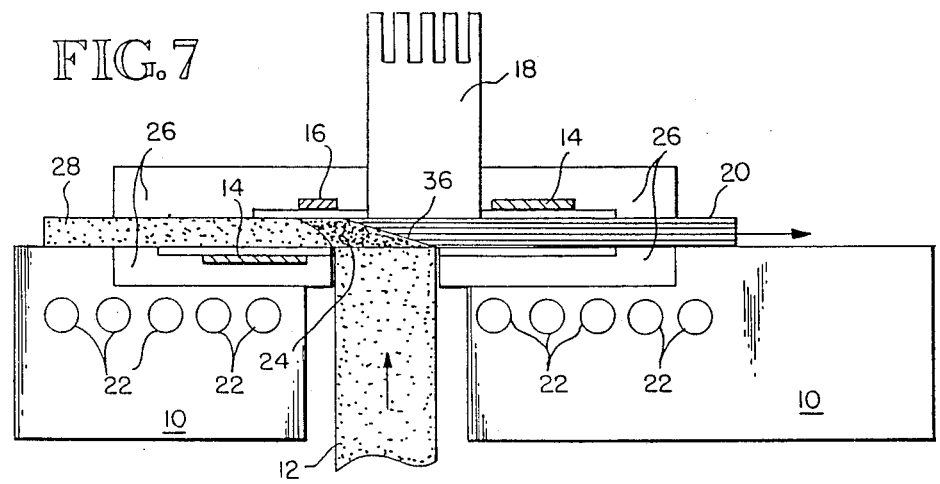

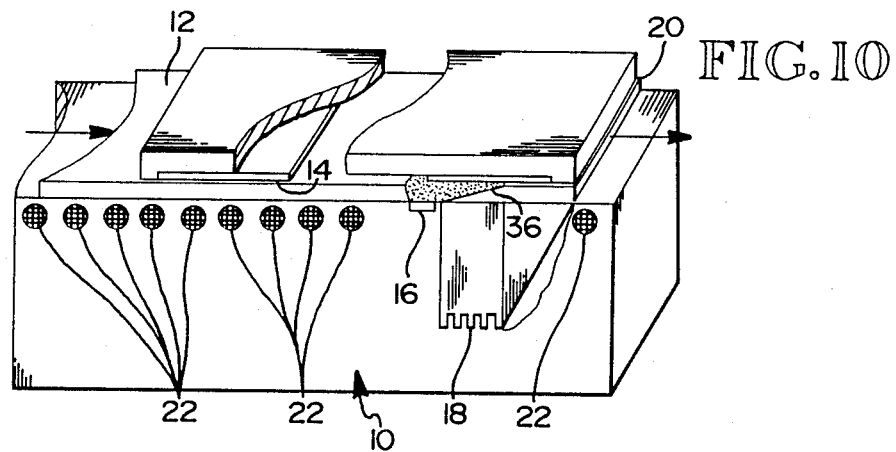
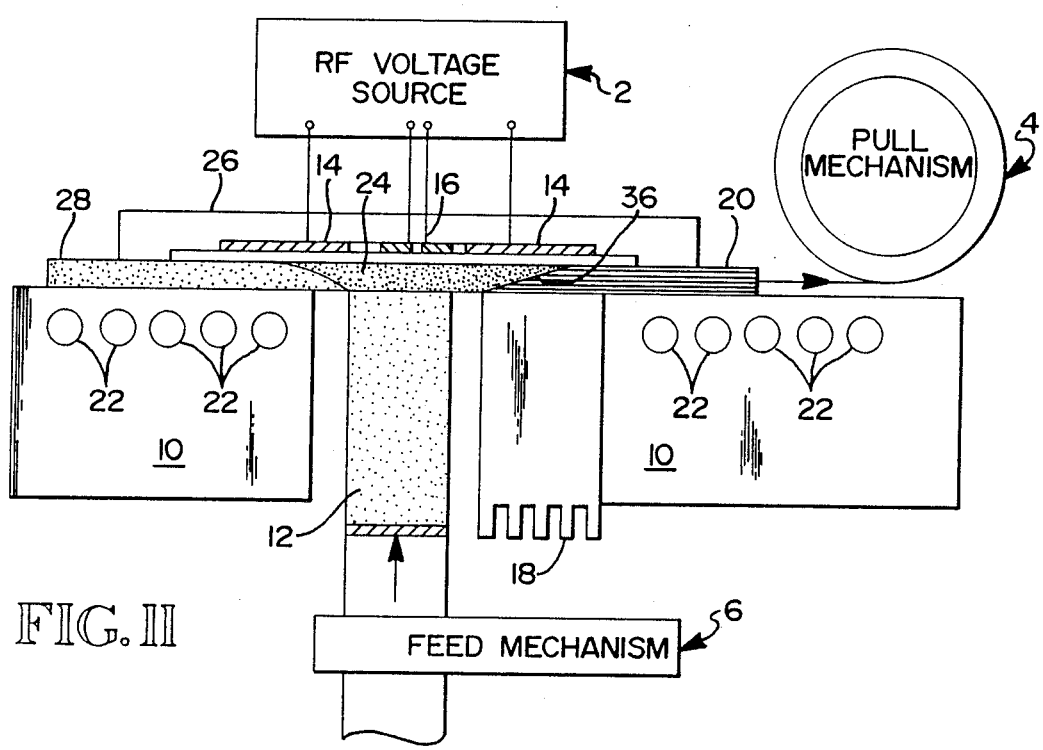

APPARATUS FOR ZONE REGROWTH OF CRYSTAL RIBBONS

This is a continuation-in-part of application Ser. No. 826,596 filed Feb. 6, 1986, now U.S. Pat. No. 4,775,443, and application Ser. No. 816,424, filed Jan. 6, 1986, now U.S. Pat. No. 4,749,438.

FIELD OF THE INVENTION

The apparatus described relates to the production of crystalline ribbons by zone melting. More particularly it relates to an apparatus for coupling electromagnetic energy into a thin layer of material in order to raise the temperature of the material to nearly its melting point except along a specific zone where the material is caused to melt.

BACKGROUND OF THE INVENTION

There is a need for thin crystalline ribbons and films of many materials such as silicon and other semiconductors. These ribbons are often very costly and difficult to produce. For example, thin wafers of monocrystalline semiconductor materials are generally produced from monocrystalline boules grown by the Czochralski technique. The preparation of the thin wafers from large crystal boules requires slicing and polishing, is a costly and time consuming technique, and inherently wastes much of the boule. Consequently, much effort has been directed toward growing thin monocrystalline ribbons that need only be scribed and broken to be used.

As reported, for example, by Chalmers, LaBelle, and Mlavsky in "Edge-Defined Film-Fed Growth," Journal of Crystal Growth, vol. 13/14, pp. 84–87, 1972, thin ribbons of semiconductors and insulators have been grown through elongated openings in a melt cover. Such growth has also been accomplished with guide posts. In these techniques the crystal is pulled in a direction perpendicular to the surface of the melt using the geometric properties of a slot in the melt cover or guide posts to establish the transverse cross section of the resulting ribbon. However, satisfactory larger ribbon widths of appropriate thickness are not favored by surface tension properties and are produced only slowly, with reduced commercial advantage. The slow growth requirement arises because the probability of grain-boundary defects is proportional to the square root of the growth velocity (pull velocity in this case), as confirmed by Pfeiffer, et al., in "Pattern Formation Resulting from Faceted Growth in Zone-melted Thin Films," Physical Review Abstracts, vol. 16, No. 10, 15 May 1985.

Ribbons of semiconductors have also been produced by pulling substantially in a horizontal plane from a melt surface, as disclosed by Bleil in U.S. Pat. Nos. 3,681,033 and 3,759,671. This latter technique produces ribbons much faster than the previous methods. However, pulling ribbons too quickly or at too great an angle from horizontal introduces grain boundaries and imperfections which degrade the performance of circuitry placed on the semiconductor surface. This fact has been described in detail in Jewett in U.S. Pat. No. 4,289,571 and Kudo in U.S. Pat. No. 4,329,195. Moreover, the necessary controls to implement the process and produce very thin crystal ribbons and film of good quality are difficult to manage and thus the commercial advantage is reduced.

It has also been proposed to horizontally produce flat ribbons by certain zone melting techniques. This has been described by Geis et al. in "Materials Research Society Symposium," vol. 13, p. 477, 1983, and Omachi et al., "Ge-Seeded Crystallization on $SiO_2$" in Electronics Letters, vol. 19, No. 8, Apr. 14, 1983, the latter by using a slider system with an rf heated strip heater. However, such techniques develop freezing isotherms nearly perpendicular to the pulling direction and have not been wholly satisfactory for producing thin ribbons of high quality at low cost. Such difficulties may be avoided by crystallization, according to the present invention. Ribbons of materials other than semiconductors may be similarly produced by zone melting and recrystallization as shown by this invention.

In some applications, it is desirable to prepare monocrystalline ribbons or films of semiconductor or other materials on an insulator substrates, such as semiconductor on insulator, or SOI, structures. This can be accomplished by growing the ribbon on the insulator or bonding the ribbon onto insulator material by using, for example, electrobonding techniques. The desired monocrystalline structure can be given to the ribbon material through a variety of "seeding" techniques, including beginning and maintaining the seeding process at a location away from the insulator material, thereby inducing a monocrystalline form to be propagated through the ribbon cross section.

For ribbons or SOI structures, a variety of methods for supplying the zone-melting energy have been used, including lasers and graphite heaters with energy-focusing means. Methods for inducing electrical currents in the semiconductor and other materials by exposing them to a high frequency electric field have been used to recrystallize the cylindrical boules in a particularly energy efficient manner. However, methods to induce current capacitively have only recently been applied to ribbons in a manner permitting control of the shape and size of the zone of recrystallization as disclosed by Bleil in U.S. patent application No. 816,424, filed Jan. 6, 1986. Capacitive coupling not only avoids electrode contact with the material but also permits a current gradient to be established within the melted zone. While it is generally desirable to avoid contact with the melt by foreign materials, in some applications the current gradient may be established by direct contact with electrodes of the same material as the melt or by other suitable means to cause zone recrystallization in a thin layer of the material in a manner allowing the shape and size of the zone to be controlled.

SUMMARY OF THE INVENTION

I have discovered that through proper placement of appropriately shaped electrodes near the surface of a thin layer of material which exhibits sufficient electrical conductivity near its melting point, heating by means of capacitively induced electrical currents can produce desirable recrystallization zone sizes and shapes. I have also discovered that similar results can be obtained by distributed ohmic contact between properly controlled electrical sources and the layer of material. Generally, in accordance with this discovery, two sets of sheet electrodes are used for the capacitively induced currents. A first set of electrodes, near the surface of the ribbon and separated in the pulling direction, induces electrical currents, within a specific portion of the layer, that are sufficient to raise the material to very nearly its melting temperature. A second pair of electrodes induce enough additional currents to cause a narrow region within the specific portion of the material to melt along a selected stable zone perpendicular to the pulling direction. Proper control of the two currents induced', in coordination with means for replenishing the melt zone and a means for removing the heat supplied by the induced currents, allows the recrystallization to take place in a desired fashion, at an acceptably high pulling rate.

According to one aspect of the invention, there is provided an apparatus for forming a crystalline ribbon-like body from a substantially planar shaped layer of material comprising heating means for capacitively coupling electromagnetic energy into the material layer to induce electrical currents and cause the material to melt along a relatively narrow melt zone within the material, means for causing relative motion between a portion of the material and the heating means, means for replenishing the melt zone, and means for controllably removing heat from the melted material in a direction substantially perpendicular to the plane of the growing crystal ribbon.

In accordance with a preferred embodiment of the invention, there is provided an apparatus for forming a ribbon of crystalline material, comprising first heating means for capacitively coupling electromagnetic energy into a layer of material to induce electrical currents which cause the layer to melt, means for causing relative motion between a portion of the layer material and the heating means, means for replenishing the melt layer, and means for controllably removing heat from the melted material in a direction substantially perpendicular to the plane of the crystallizing ribbon. The layer of material may include a monocrystalline seed and the first heating means can comprise a pair of substantially parallel electrodes spaced apart in the pulling direction, slightly spaced away from the plane of the layer and connected to a source of alternating voltage. Alternatively, the electrodes can directly contact the layer if precautions are are taken to establish the desirable current gradient in the melt layer of the ribbon.

Optimally, the first heating means is used to attain a temperature very near the melting temperature without melting the layer, second heating means for coupling electromagnetic energy into the layer are used to induce electrical currents causing the layer material to melt along a relatively narrow region transverse to a predetermined pulling direction. A variety of configurations for the second heating means are possible, including (1) two sets of colinear interdigitated electrodes coplanar with, or parallel to and on the opposite side of the ribbon-like layer from, the first heating means, and located between the two electrodes of the first heating means and (2) a pair of substantially parallel electrodes, coplanar with, or parallel to and on the opposite side of the ribbon-like layer from, the first inductive heating means and spaced apart in the pulling direction. The first and second heating means are connected to independent rf voltage sources.

An alternative high-frequency voltage heating means comprises only three parallel electrodes spaced apart in the pulling direction with a first high-frequency voltage source connected between first and second electrodes and a second high-frequency voltage source connected between the second and third electrodes. The two voltage sources operate at different frequencies. The three electrodes may be on the same or different sides of the ribbon-like layer.

BRIEF DESCRIPTION OF THE DRAWINGS

FIG. 5 is an enlarged fragmentary view of a modification of the selective heat sink of FIG. 3, to allow for radiative cooling;

FIG. 6 is an exaggerated enlarged fragmentary view of a seed-heat sink contact region of a further modification of the apparatus in FIG. 2, wherein the heat sink is provided by the passage of cooling gasses over the ribbon;

FIG. 7 is an exaggerated elevational view of another electrode configuration in which the primary electrodes are parallel but on opposite sides of the ribbon.

FIG. 10 is an isometric view of another embodiment of the apparatus used for ribbon-to-ribbon recrystallization in which the melt replenishment is a ribbon; and FIG. 11 is an exaggerated elevational view in partial section to illustrate some of the typical ancillary apparatus normally used to implement this invention.

DESCRIPTION OF THE PREFERRED EMBODIMENT

A better appreciation of the various aspects of the invention may be gained by reference to the figures of the drawings. Principal features of the invention lie in the localized application of heat to a layer of material to initiate and/or sustain a stable melt zone of controlled shape, the selective removal of heat in a direction perpendicular to the pulling direction at the crystal growing end of the melt zone, replenishment of the melt as required, and the suppression of the loss of the heat of fusion from the balance of the material layer. The heat is applied locally by inducing electrical currents in the material by relatively closely spaced electrodes, melting the layer in a narrow zone. Due to the arrangement for producing electrical currents in the material, a current gradient at the end of the ribbon can be controlled to optimize the shape of the ribbon-melt interface. A heat sink in physical contact with the growing ribbon can be used to selectively remove the heat of crystallization from the selected end of the growing ribbon as shown in FIGS. 1-4, and 7. On the other hand, the heat can be removed by simply allowing it to radiate to the ambient or by use of cooling gases as shown in FIGS. 5 and 6, respectively. The end of the ribbon contacting the melt where the heat of fusion is removed becomes the seed end of the growing ribbon.

The melt zone is suppressed in the balance of the layer by controlling the current from primary and secondary electrodes. The melt zone is confined and additionally stabilized, when required, with the secondary electrodes, to be within the heated zone defined by the primary electrodes. Growth rate can be suppressed by reducing the rate of heat loss of the heat of fusion. This can be done by controlling the secondary heat source and/or the selective heat sink.

Figure 9:
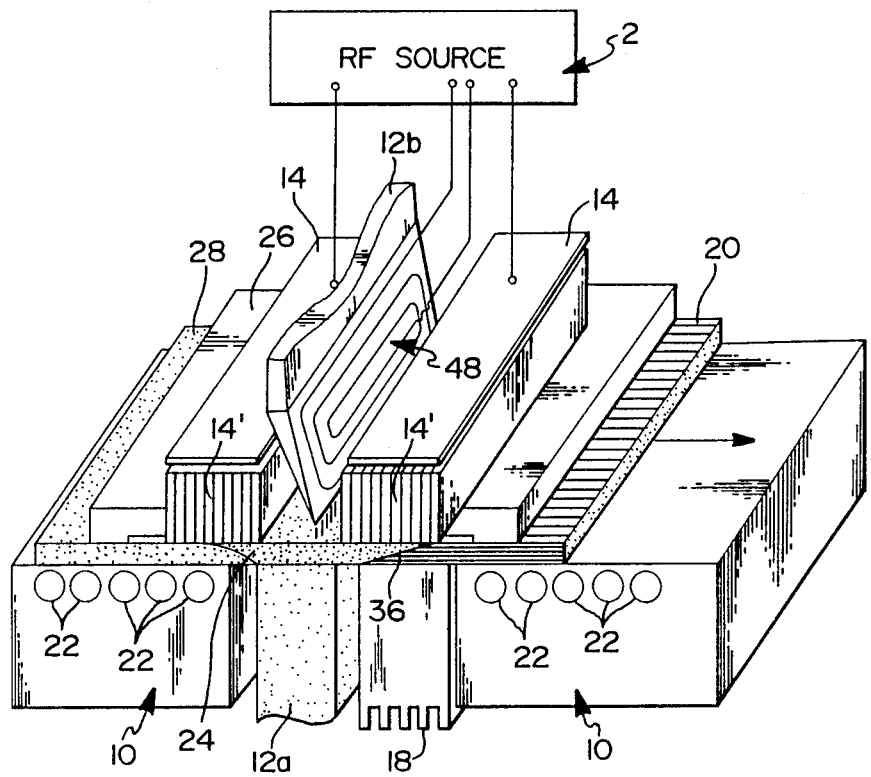
FIG. 9 is an exaggerated isometric view in partial section of a modification of the apparatus of FIG. 1 in which the primary heat source comprises a set of electrodes contacting the melt, first and second electrodes each comprising a laminated set of electrically isolated conductors which provide suitable interaction with the melt, a first electrode capacitively coupled to one side of a high-frequency voltage source, and a second electrode capacitively coupled to the other side of the high-frequency voltage source.

A special heater may replace the uncontrolled loss of the heat of fusion, or a heat reflector may reduce the undesired radiative loss of the heat of fusion. If there is any actual uncontrolled loss of the heat of fusion, it is replaced by a heat source other than the melt itself. For example, such a heat source might be placed around or adjacent to the source material, as shown in FIG. 9. Hence, the heaters and/or heat reflectors, along with the selective heat sink, establish a freezing isotherm between the growing ribbon and the melt that is determined in part by the selected ribbon width and thickness.

Because the probability of generating dislocations in a growing crystal is nearly proportional to the square root of the growth velocity, it is important to keep the growth velocity low even while maintaining a high pulling rate. This is accomplished by keeping the freezing isotherm as close to parallel to the pulling direction as practical. Angles less than 10 degrees are desired.

When the growing ribbon is pulled substantially parallel to the direction of the current induced by the primary electrodes, the molten zone and recrystallization may be distorted in the direction of pulling but remains essentially fixed in space as a narrow region of closely controlled crystal growth. Unlike other systems for zone recrystallization, the principal regrowth direction in this embodiment occurs substantially perpendicular to the pulling direction, except at the tip of the growing ribbon.

The surface of the growing ribbon facing the selective heat absorber and the surface of the molten zone should be coplanar, at least where they are adjacent to the growing tip of the ribbon. The growing tip is the intersection of the freezing isotherm with the ribbon surface facing the heat sink.

The growing tip can be made coplanar with the adjacent melt surface by making the entire ribbon coplanar with the surface of the molten zone. The surface tension of the material can maintain this coplanarity. Coplanarity is also achieved by using, for example, the material source as a contact element that is wetted by, but does not contaminate the melt. A special application of this approach is shown in FIG. 9. This again allows the surface tension forces to maintain the ribbon-melt coplanarity at the tip. I prefer to use both principles where appropriate to the desired goal.

The new growth on the ribbon may tend to adhere to the heat sink means, depending on the material. The crystal can be prevented from adhering to the contacting surface of the heat sink if there is no strong reaction between their contacting surfaces near the crystal melting point, or if they are not touching. If crystal-heat-sink adherence is a problem, an interface may be used between the ribbon and the heat sink, and/or nucleation of the crystal must be induced sufficiently far away from the heat sink. This can be readily accomplished by several means: (a) adjusting the spacing of the primary electrodes, (b) positioning of the secondary heat source, the replenishment source, or the selective heat sink, (c) pulling the ribbon at the appropriate rate, or (d) adjusting the rate of nucleation to substantially maintain this spacing during growth. Moreover, heat removal may be accomplished by radiative cooling or by convective or conductive cooling by an inert gas such as argon or helium, thus avoiding heat sink adherence or contamination.

Of course, the usual precautions pertaining to the choice of materials, ambient atmosphere, vibration-free environment and other routine growth conditions, well-known to those skilled in the art, should be observed with this invention, just as they would in the usual zone melting and crystal growing techniques.

For the implementation of the invention several additional factors must be considered. It is noted that the invention applies equally well to many metals and semiconductors and certain insulators that exhibit significant electrical conductivity near their melting point. Most materials will show measurable changes in their density, surface energy, electrical and thermal conductivity as they undergo the phase change from solid to liquid at their melting temperature.

Figure 2:
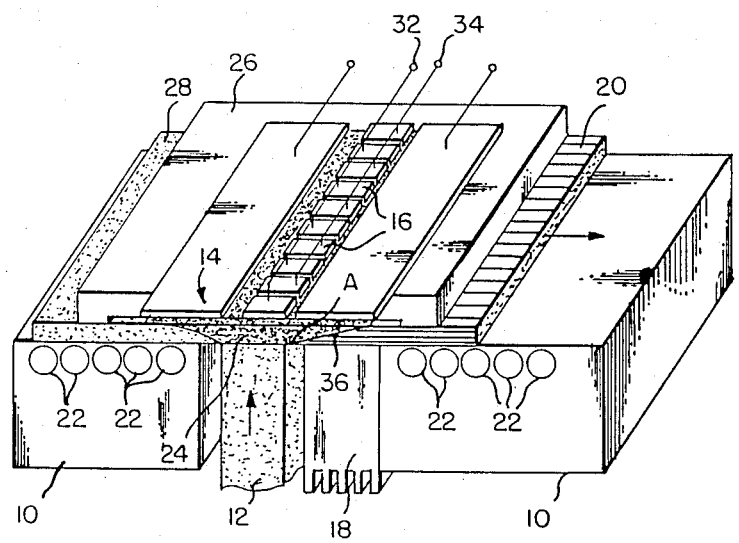
FIG. 2 is an enlarged fragmentary isometric view in partial section of a modification of the apparatus of FIG. 1 in which a secondary heat source is shown as a set of interdigitated electrodes.

The particular embodiment of this invention to be used for a particular ribbon material will depend on the property changes mentioned above. For materials, such as silicon, whose electrical conductivity is greater in the melt than in the solid, it is prudent to use an embodiment that stabilizes the melt against small local fluctuations in the electrical resistance as shown in FIG. 2. Lack of stability can lead to disruptive melt zones and irregular regrowth.

Other apparatus embodiments for certain materials of this type are also possible. For example, a single coil configuration consisting of a multiplicity of turns around the ribbon to be melted and in a plane substantially parallel to the ribbon can induce a eddy current in a narrow zone in which the current flows across the width of the ribbon in a direction substantially perpendicular to the pulling direction. Only very special coil designs are available with this embodiment to produce the desired current gradient in the plane of the ribbon parallel to the pulling direction. When melting occurs the result of each of the above embodiments is to confine and stabilized the molten zone.

Figure 1:
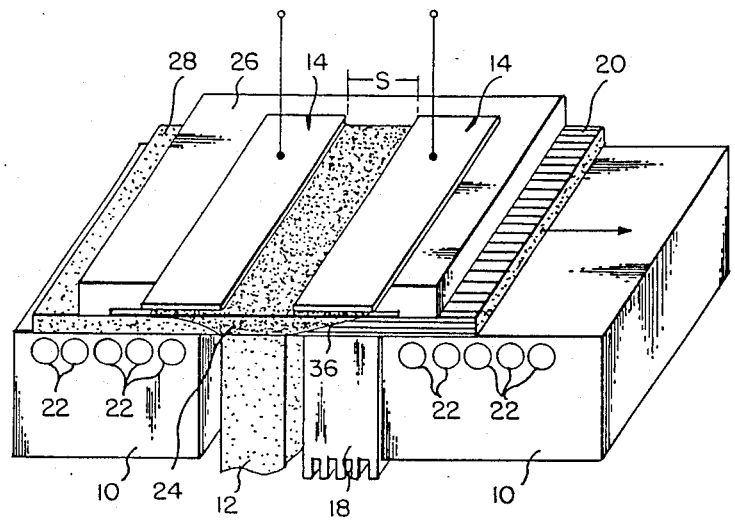
FIG. 1 is an exaggerated isometric view in partial section of the melt area of a zone-melt growing apparatus provided with a melt replenishment source and a heat sink for horizontal crystal growing in accordance with the invention.
Figure 3:
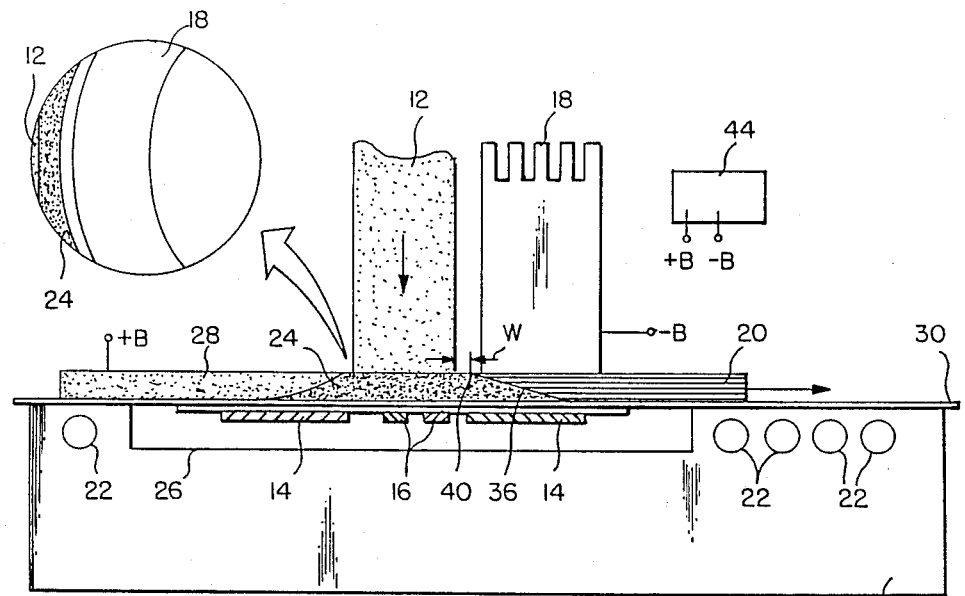
FIGS. 3 is an enlarged fragmentary elevational view of the melt-seed-heat sink contact region of an inverted configuration of the apparatus shown in FIG. 1 with a modified secondary heat source consisting of two parallel electrodes.
Figure 4:
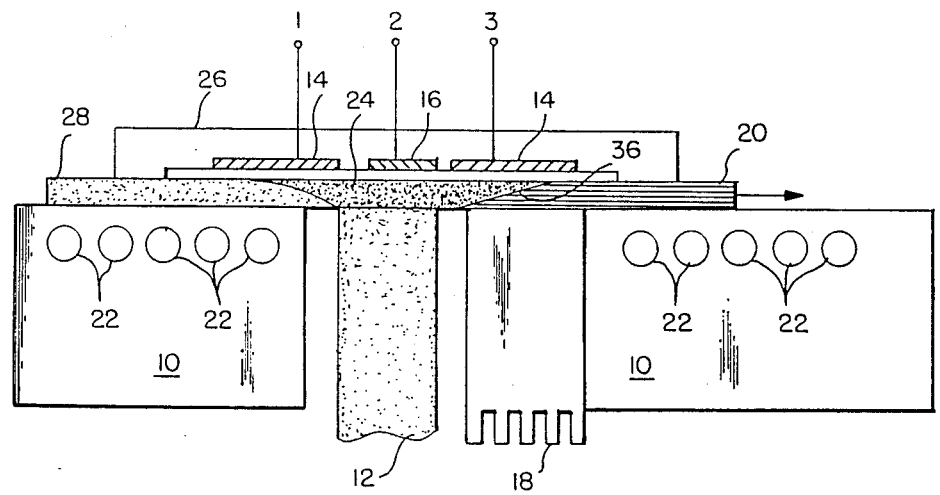
FIG. 4 is an enlarged fragmentary elevational view of a modification of the secondary heat source for the apparatus shown in FIG. 2 in which a single electrode is provided for the secondary source.

For material, such as lead and many metals, where the conductivity of the solid is significantly larger than the liquid at the melting point, it may be convenient to use an electrode configuration as shown in FIG. 1 or as shown in FIGS. 3 and 4 with or without the secondary electrodes.

Still another electrode configuration for this class of materials is represented by the placement of the primary electrodes on opposite sides of the ribbon as shown if FIG. 7. For special cases dictated by the material properties, a second heat sink may be desired to control the shape of the melt zone and the angle of the freezing isotherm relative to the pulling direction. For materials of this type the molten zone is automatically stabilized with regard to local variations in electrical conductivity and will remain between the electrodes. One or another of these configurations will also serve for the special case for which there is no change in the electrical conductivity during melting.

For all types of ribbons above (e.g. silicon, bismuth or lead) it is also necessary to consider the ratio of the surface energy to the density at and above the melting point. Silicon exhibits a very large surface energy-to-density ratio as compared to bismuth or lead. The result of this property is that the width W of a stable silicon melt zone free surface as shown in FIG. 3 (horizontal growth) will be much smaller than that for bismuth or lead. For the case of silicon ribbon less than 500 micrometers thick this width of the molten zone free surface is comparable to the ribbon thickness whereas, for bismuth in this configuration, widths five times the thickness have been observed. This parameter may be relaxed when the ribbon is made to adhere to a solid substrate. Silicon films 0.5 micrometer thick on a quartz substrate have been shown to support a stable melt zone free surface 2 mm wide.

In addition to the above it is known that silicon, for example, exhibits a significant increase in its thermal conductivity as it passes from the solid to the liquid state. Such changes as this can alter the central point for the applied voltages to the primary and secondary electrodes as well as the control temperature and thermal profile for the heat sink. These parameters may be separately adjusted during processing as well as the electrode spacings, relative to the ribbon, the heat sink, and to each other.

For simplicity, the subsequent discussion will be restricted to one ribbon material, i.e. silicon. While, in the following discussions, the source body will be assumed to be in the form of a solid, those skilled in the art recognize that the source body can take any of a variety of forms. These include powders, compacts or even properly constrained melts or liquids as shown in FIG. 9.

FIGS. 1 and 2 show the melt zone area of a silicon crystal ribbon growing apparatus made in accordance with the invention. To focus attention on the improvements this invention presents, many of the ancillary features normally incident to zone melting crystal growth apparatus, such as a housing and support means for producing a protective environment, heater power supplies, pulling apparatus, and the like, are not shown. However, for example, as indicated in FIG. 11, the apparatus would involve heating power supplies 2, a controlled pulling system 4, a means for precision positioning of the electrode ensembles, a means 6 for moving source material into the melt zone, 24 a regulated atmosphere environment, temperature monitoring, etc.

In the areas of the crystal growing apparatus within which the principal processing will occur, a heated platform 10 with heaters 22 is provided on which is placed a seed ribbon 20 of monocrystalline silicon. The ribbon 20 can be placed and transported on a continuous thick substrate 30, as shown in FIGS. 3 and 5, made, for example, of an electrically insulating material, depending upon the application for which crystallized ribbon 20 is intended. It will be understood by those skilled in the art that some applications will not require or use a substrate 30 or that other conducting substrates can be used. The ribbon can typically be 100 micrometers thick. The ribbon is pulled toward the right in FIG. 1. The left end 28 of the ribbon is clamped to the platform 10 when ribbons are pulled in only one direction and when non-colinear source material is provided. The platform 10 maybe typically four inches wide and four feet long although the method and apparatus of the present invention work regardless of these dimensions. In the central processing region, two principal sheet electrodes 14, shown in FIGS. (1–6), mutually coplanar and parallel and extending the full width of the ribbon 20, are positioned in close proximity to the ribbon 20 with an interelectrode space s along the greater length of the electrodes. The electrodes are each 75 mm wide, 100 mm long and 0.10 mm thick. They are spaced 30.1 mm apart along their greater length and positioned about 0.100 mm from the ribbon 20. The spacing between the electrodes is chosen to permit the source material 12 to pass between them, if desired. Some of these dimensions are exaggerated in the figures to make certain features of the apparatus more apparent. The principal electrodes are mounted on a support 26 held away from the grown ribbon. This support provides high temperature stability for the electrodes. The primary heating means will provide rf resistance heating in the region below and between the principal electrodes (approximately 180 mm), capacitively producing a current gradient in the melt zone below the electrodes in this embodiment.

In the region between the principal electrodes 14, two sets of secondary sheet electrodes 16 are placed, as shown in FIG. 2, to provide the additional localized heating when required to cause stable melting within the heated zone. These electrodes are 20 mm wide, collectively 100 mm long and individual electrodes are spaced apart 0.20 mm. They are substantially parallel to the principal electrodes 14.

The members of one set of secondary electrodes alternate, or are interdigitated, with members of the other set. As shown in FIG. 2, the members of each of these two sets are electrically connected through wires 32 and 34, respectively. By connecting a high-frequency voltage source between wires 32 and 34, the desired narrow molten zone 24 is created. The frequency of the electrical voltage applied to the secondary electrodes may differ from that of the primary electrodes, depending on the material and electrode spacings, and the electrode geometry. For the dimensions given above, an appropriate frequency for the primary electrodes will be approximately 13.6 MHz. It will be understood by those skilled in the art that these dimensions may be varied in accordance with the source dimensions, heating requirements and the rf frequencies used. The molten zone produced by the secondary heat source 16 will preferably have its free surface width W (see FIG. 3) comparable to or less than the ribbon thickness, when required for stable growth.

The current induced in the heated region by the principal electrodes 14 and secondary electrodes 16 will reach a maximum when the ribbon temperature is near the melting point (1412 degrees C) for silicon but for which melting has only occurred within the boundries of the principal electrodes and adjacent to the source material. The initial resistance of the region between the principal electrodes 14 is lowered by being preheated by the heated platform 10, if required, in order to allow them to function properly.

When a secondary heater is required as shown in FIG. 2, the melt zone will appear when the secondary heater 16 provides and/or maintains at least a portion of the heat of fusion required for the selected melt volume. In this preferred embodiment the silicon ribbon 20 is 100 mm wide and 0.10 mm thick. The free molten zone is nominally 30 mm wide, 0.100 mm thick and 100 mm long (that is, the full width and thickness of the film.) The width of the melt shown at "A" in FIG. 2 is comparable to the ribbon thickness.

Figure 8:
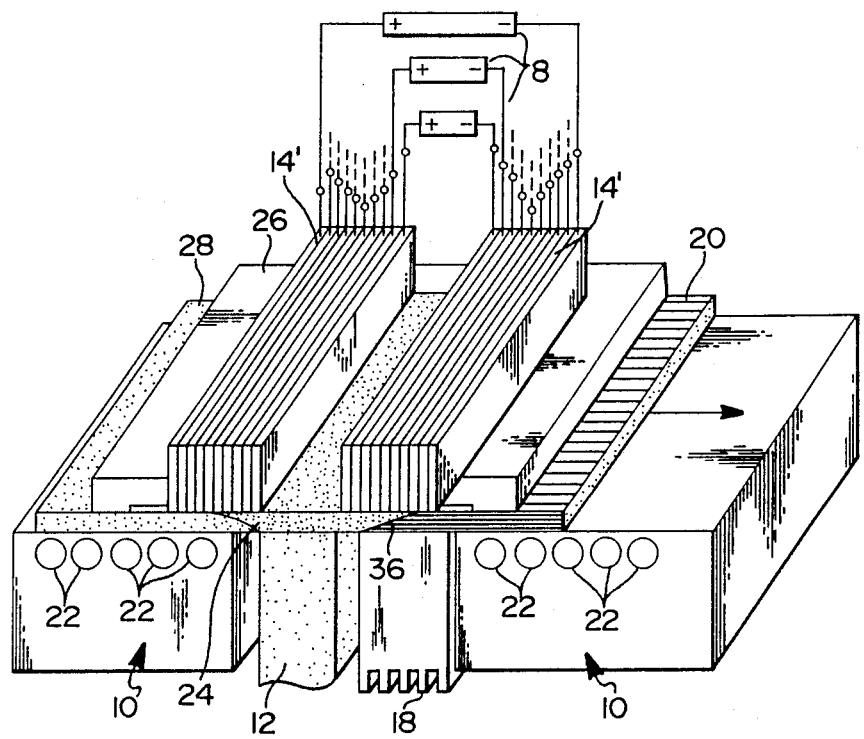
FIG. 8 is an exaggerated isometric view in partial section of a modification of the apparatus of FIG. 1 in which the primary heat source comprises a set of electrodes contacting the melt zone, first and second electrodes comprising laminated sets of electrically isolated conductors which provide suitable interaction with the melt such that each conductor of the first electrode is coupled through a current controlled power source with only one conductor of the second electrode.

For some materials such as silicon, as shown in FIG. 8, the current and desirable current gradient may also be produced in the melt zone below the primary heating means first and second electrodes 14' each comprising a laminated set of conductors or segments, such as oxide coated silicon sheets, electrically isolated from one another, wherein each conductor provides planar ohmic contact and is neither contaminating nor undesirably reactive with the melt and each sheet conductor of the first electrode is coupled through a current controlled supply 8 of dc voltage with only one conductor of the second electrode.

The multiplicity of current control circuits may be significantly reduced by capacitively coupling an rf voltage to the laminated electrode structure 14' as shown in FIG. 9. In this modification, the primary heat source comprises a set of first and second electrodes 14', each comprising a laminated set of electrically isolated conductors which provide suitable interaction with the melt, and a sheet electrode 14 connected to a high-frequency voltage source 2 and capacitively coupled to the laminated conductors. The current produced in each of the laminated conductors depends on the cross section of the conductor, the electrical properties of the system and the power supplied. In special cases where the heat of fusion is very large and the electrical conductivity of the melt exceeds the solid, the laminated electrodes 14' may be replaced by a single sheet electrode placed parallel to the ribbon provided the conductivity difference is sufficient to permit the current gradient in the melt to be maintained.

Heat sink 18, for example, a heat pipe, extracts heat from the molten zone at a rate just sufficient to maintain the melt-crystal isotherm 36 in the heated region.

A source of new silicon material 12, 30 mm thick and having the width of the ribbon, is introduced through one free surface of the melt zone. This may be provided from below as shown in FIG. 2 and serve as one boundry of the melt zone. It can be seen in FIG. 2 that the melt in this embodiment does not make contact with any foreign substance which might contaminate the growing crystal ribbon. In this sense this particular embodiment constitutes a "crucible-less" regrowth of the crystal ribbon. As cited and shown in FIGS. (1-7), source material may be introduced from either free surface of the melt zone. There may also be an advantage to the introduction of source material from more than one free surface of the melt zone as shown in FIG. 9. In this configuration, one source 12a may principally provide melt stability, while the other source 12b may principally provide the replenishment of the melt. The principal melt replenishment source 12b shown in FIG. 9, incorporates an induction heater 48, which provides the heat required to reach the melting point as well as the heat of fusion so that the current provided by the primary electrodes may be kept low and nearly constant. The rate of replenishment of the melt is controlled by monitoring the shape, size, and thickness of the melt zone and of the growing crystal ribbon.

FIG. 10 shows another mode of replenishment of the melt. There the source material is a ribbon 12 supported in the plane of the ribbon 20 and is advanced to enter the melt zone in the same direction and at the same rate as the ribbon 20 is grown. This arrangement affords ribbon-to-ribbon recrystallization. Further details of the apparatus for this mode are found in my co-pending application Ser. No. 816,424, now U.S. Pat. No. 4,749,438 which is hereby incorporated by reference.

Extracting heat from one side of the ribbon, positioning the secondary heat source nearer to the heat sink than to the fixed portion of the layer, and providing primary heating from the side opposite the heat sink promotes nucleation of crystalline silicon on the side of the heat sink in the direction opposite to the pulling direction, while principal growth continues substantially perpendicular to the pulling direction. That is, the melt-crystal isotherm 36 is substantially as shown in FIG. 2. In FIG. 2 the nucleation occurs at the free surface of the melt, while in certain inverted configurations in which a substrate is used, such as that shown in FIG. 3, the nucleation may be caused to occur in the proximity of a substrate such as 30. The latter configuration would have the heat sink adjacent to the substrate and would be particularly useful when liquid epitaxy is to be exploited.

Several techniques are available for initially seeding the crystal growth in the desired crystal orientation. After initial seeding, continuous seeding will be subsequently established by the growing crystal ribbon. In a preferred embodiment a seed 20 whose thickness and width are substantially the same as the ribbon to be grown (i.e. 100 mm wide and 0.10 mm thick) is selected (see any of the Figures). The length of the seed selected is commensurate with the needs of the crystal pulling attachment (not shown). The major faces of the selected seed are parallel and in the (100) plane when this orientation is desired. The seed is oriented, for example, so that the pulling will take place along the <010> direction.

Other techniques, well-known in the art, may also be used to provide initial seeding for each growth as required. For example, a seed may be inserted into the melt zone from the right or a single crystal growth may be gated by necking down the growing ribbon width one or more times to eliminate alternative crystal orientations.

FIGS. 3-7 show modifications of the apparatus illustrated in connection with FIGS. 1 and 2. The modifications involve the construction of the heat sink used to selectively remove heat from the growing ribbon (or seed ), a means to enhance and control nucleation, and the nature of the special heat source used to maintain the desired freezing isotherm within the molten zone.

Reflectors may be selectively introduced to reduce the heat loss from the molten zone. The reflective properties, such as good infrared reflection, are used to return the energy radiated from the molten zone back into the molten zone. In certain embodiments the electrodes may serve as reflectors if desired.

In FIG. 3 another embodiment of the secondary heat source incorporates two parallel electrodes with their separation along their greater length. This configuration is preferred when the melt exhibits a higher resistance than the solid of the material being processed and additional melt stability is required. The primary electrodes are connected to a first rf voltage source, while the secondary electrodes are connected to a second rf voltage source. By properly controlling the two voltage sources, the melt zone can be kept within desirable limits.

In FIG. 4 the heater comprises a special combination of primary and secondary electrodes 14 and 16 to achieve ribbon melting only in the region of the single central (secondary) electrode 16. To achieve this result voltages having different frequencies are applied to the outer electrodes, with the central electrode 16 grounded. Thus, when the two applied voltages are out of phase a current passes principally between the outer electrodes 14, while when they are in phase essentially no current passes between the outer electrodes and nearly twice the current passes to ground through the center electrode 16. Proper selection and control of the frequency difference, electrode size and spacing, and the applied voltage will selectively heat the area between the outer electrodes but only melt the region near the center electrode. In this configuration, heat can be removed from the lower surface by heat sink 18.

An ancillary line heating source may be used in place of the secondary heater 16 shown in the preceding figures. Such a source might be an electron line source, or any highly localized line source, such as a laser, to permit the molten zone to be confined in the heated region.

In FIG. 5 the heat loss is achieved by radiative cooling to realize slow cooling and/or to avoid possible melt-heat sink contact. The lower electrodes 16 and 14 may be used as reflectors to return heat radiated by the molten zone, and heat of fusion is lost by the radiation process by way of a non-contacting heat sink 38.

FIG. 6 shows a modification of the apparatus of FIG. 1 wherein the heat loss is achieved by convective cooling with an inert gas such as argon or helium. A gas conductive cooling means using, for example, an inert gas with a high thermal conductivity, such as helium gas coupled to a non-contacting heat sink is also applicable to this configuration.

As shown additionally in FIG. 3, a modification of the apparatus of this invention, intended to assist in the control of the nucleation region consists of a bias DC voltage source 44 which is applied to the ribbon across the growing interface 36. This voltage alters the local chemical potential in the vicinity of the growing ribbon interface 36 and enhances the nucleation at the apex 40 of the growth. In the embodiment shown, the highest field due to the applied DC voltage will appear at the tip of the growing crystal. While one field direction is shown, the opposite direction may be required, depending on the ribbon material.

As cited earlier a modification of the apparatus may be used for those ribbon materials that exhibit an increase in electrical conductivity in the molten state. They can be melted by generating an eddy current across the ribbon substantially perpendicular to the pulling direction. The induced current in this modification is produced by a multiplicity of turns around the ribbon so that the plane of the coil is nearly parallel to the plane of the ribbon. The coil extends beyond the edges of the ribbon so that the induced current will lie substantially in the plane of the ribbon and is perpendicular to the pulling direction with a current gradient parallel to the pulling direction.

The apparatus of any of the preceding figures can, of course, be operated without the secondary heating source 16, when the properties of the ribbon material so warrant or the various embodiments shown can be built without the secondary heater. While all of the figures may suggest that the process applies only to horizontal pulling of the ribbon, no such orientation constraint of the apparatus is envisioned. The constraints imposed by gravity will of course apply to heat pipes if they are to be used as a heat sink for the apparatus. Similar gravitational constraints may apply for dense materials with low surface energy, such as bismuth or lead. Moreover, the figures suggest that the secondary electrodes are all nominally rectangular. This is not a constraint envisioned. In particular, in accordance with well known art, the heat sink 18 and/or the secondary heat source 16 may exhibit a curvature which is convex to the pulling direction so that the laterally central portion of the growing ribbon as well as the upper free surface (see the top view of FIG. 3) will exhibit nucleation and growth before the edges or the bottom of the ribbon. Such techniques to control nucleation are well known to improve the as-grown crystal quality.

FIG. 7 of the drawings illustrates that for such material as lead, although primary and secondary heaters are preferably coplanar, it is not necessary that they be. FIG. 7 shows primary heaters 14 which are on opposite sides of ribbon 20, and, therefore, not coplanar. This could, of course, be true even when the secondary heaters 16 are removed, or not used. In the case where primary electrodes are not coplanar, it may be desirable to have a second heat sink in order to establish better control the profile of the melt zone in the ribbon.

While all of the discussion in the above has been directed toward a method and apparatus for recrystallizing the processed material to a monocrystalline form, those skilled in the art will recognize that the method and apparatus of the present invention can be useful to generally increase the crystal grain size of the processed material.

It should be appreciated that although this invention has been described in connection with certain specific examples thereof, no limitation is intended thereby except as defined in the appended claims.

I claim:

1. An apparatus for forming a crystalline ribbon from a source body of material, comprising:
   means for supporting a film of material in a plane;
   heating means comprising generally planar electrodes parallel to the said plane for producing electrical currents in the material causing a planar film of material to melt along a zone in the source body,
   means for controllably removing heat from the melted planar film of material in a direction substantially perpendicular to the plane to effect ribbon growth,
   means for causing relative motion in a direction substantially parallel to the film between the ribbon and the heating means; and
   means for replenishing the melted film.

2. An apparatus of claim 1 wherein the generally planar electrodes are spaced from and capacitively coupled to the material for inducing electrical currents in the material, whereby a current gradient for controlling the melt zone is established in the material.

3. An apparatus of claim 2 wherein the generally planar electrodes comprise a first sheet electrode coupled to the planar film of material and a second sheet electrode coupled at least in part to the ribbon and in part to the melt for affecting ribbon growth.

4. An apparatus of claim 1 wherein the generally planar electrodes have independent segments in electrical contact with the material for applying electrical currents to the material, whereby a current gradient for controlling the melt region is established in the' material.

5. An apparatus of claim 1 wherein the means for replenishing the melted film comprises means for causing relative motion of the film of material toward the melt zone.

6. An apparatus of claim 1 wherein the means for replenishing the melted film comprises a source body of material adjacent the melt zone and means for moving the body of material toward the melt zone in a direction transverse to the direction of ribbon growth.

7. An apparatus for forming a crystalline ribbon-like body from a substantially planar film of material, including a seed of monocrystalline material at one end of the body, comprising:
   means for supporting a film of material in a plane;
   heating means comprising primary heating means in the form of sheet electrodes parallel to the said plane for producing electrical currents in the material to heat a portion of the material to a temperature near its melting temperature without causing melting, and secondary heating means fixed with respect to the primary heating means for coupling energy into a relatively narrow portion of the film of material, thereby causing the material to melt along a relatively narrow region within the film;
   means for causing relative motion in a direction substantially parallel to the film between the film of material and the heating means;
   means for controllably removing heat from the melted planar film of material in a direction substantially perpendicular to the material; and
   means for replenishing the film.

8. An apparatus for forming a crystalline ribbon-like body from a substantially planar film of molten material, comprising:
   means for supporting a film of material in a plane;
   heating means comprising primary heating means in the form of sheet electrodes parallel to the said plane for producing electrical currents in the material to heat a portion of the material to a temperature near its melting temperature without causing melting, and secondary heating means for coupling energy into a relatively narrow portion of the film of material, thereby causing the material to melt along a relatively narrow region within the film;
   means for causing relative motion in a direction subatantially parrllel to the film between the ribbon-like body and the heating means;
   means for controllably removing heat from the melted planar film of material in a direction substantially perpendicular to the material, and
   means for replenishing the melted film comprising a source body of material adjacent the melt zone and means for moving the body of material toward the melt zone transverse to the planar film.

9. The apparatus of claim 1 wherein the heating means comprises a pair of substantially parallel electrodes spaced apart in the direction of motion and slightly spaced from the plane of the film material, and radio frequency voltage means connected to the pair of electrodes.

10. The apparatus of claim 9 including secondary heating means for inducing melting in a narrow region comprising two secondary electrodes between and substantially parallel to the said substantially parallel electrodes of the heating means, and connected to the radio frequency voltage means.

11. The apparatus of claim 1 wherein the heating means comprises a pair of substantially parallel electrodes spaced apart in the direction of motion and electrically contacting the film of material, at least the electrode nearest the ribbon having a plurality of separate segments each for supplying a quantity of current to the ribbon, and electrical source means connected to the pair of electrodes for supplying a controlled current to each segment.

12. The apparatus of claim 11 wherein the electrical source means is a dc source coupled to the electrodes to supply dc current to each segment.

13. The apparatus of claim 11 wherein capacitor electrode means for said pair of electrodes is in capacitive coupling relation with each segment, and the electrical source means is a radio frequency voltage means coupled to the electrodes through the capacitor electrode means.

14. The apparatus of claim 1 wherein the electrodes of the heating means are coplanar.

15. The apparatus of claim 1 including a secondary heating means for inducing melting by applying energy in a narrow region between the electrodes.

16. The apparatus of claim 15 wherein the secondary heating means comprises two sets of colinear interdigitated electrodes parallel to the said planar electrodes, and a source of radio frequency voltage having terminals respectively connected to the two sets of interdigitated electrodes.

17. The apparatus of claim 16 wherein the electrodes of the secondary heating means are coplanar with and between the electrodes of the primary heating means.

18. The apparatus of claim 15 wherein the secondary heating means comprises a line source of radiation.

19. The apparatus of claim 1 having means for enhancing growth at the ribbon-melt interface comprising means for applying a dc voltage across the interface.

20. The apparatus of claim 19 wherein the means for removing heat is positioned for electrical contact with the ribbon, and the means for enhancing growth includes means in electrical contact with the melted planar film and a dc voltage source connected between the means for removing heat and the means in electrical contact, whereby a potential is provided for enhancing the ribbon growth.

21. The apparatus of claim 1 wherein the planar electrodes comprise first, second and third electrodes spaced from the film of material, the second electrode lying between the first and third electrodes;
   a first source of radio frequency voltage operating at a first frequency and connected between the first and second electrodes; and
   a second source of radio frequency voltage operating at a second frequency and connected between the second and third electrodes.

* * * * *